United States Patent [19]
Zhou et al.

[11] Patent Number: 5,929,800
[45] Date of Patent: Jul. 27, 1999

[54] CHARGE INTEGRATION SUCCESSIVE APPROXIMATION ANALOG-TO-DIGITAL CONVERTER FOR FOCAL PLANE APPLICATIONS USING A SINGLE AMPLIFIER

[75] Inventors: Zhimin Zhou, Pacific Palisades; Bedabrata Pain, Los Angeles, both of Calif.

[73] Assignee: California Institute of Technology, Pasadena, Calif.

[21] Appl. No.: 08/906,402

[22] Filed: Aug. 5, 1997

Related U.S. Application Data

[63] Continuation-in-part of application No. 08/744,955, Nov. 7, 1996, Pat. No. 5,793,322
[60] Provisional application No. 60/023,195, Aug. 5, 1996.

[51] Int. Cl.⁶ ................................................... H03M 1/38
[52] U.S. Cl. ............................................................ 341/161
[58] Field of Search ...................................... 341/161, 155, 341/164, 136

[56] References Cited

U.S. PATENT DOCUMENTS

| | | | |
|---|---|---|---|
| 5,801,657 | 9/1998 | Fowler et al. | 341/155 |
| 5,805,097 | 9/1998 | Yung | 341/161 |

*Primary Examiner*—Brian Young
*Attorney, Agent, or Firm*—Fish & Richardson P.C.

[57] ABSTRACT

An analog-to-digital converter for on-chip focal-plane image sensor applications. The analog-to-digital converter utilizes a single charge integrating amplifier in a charge balancing architecture to implement successive approximation analog-to-digital conversion. This design requires minimal chip area and has high speed and low power dissipation for operation in the 2–10 bit range. The invention is particularly well suited to CMOS on-chip applications requiring many analog-to-digital converters, such as column-parallel focal-plane architectures.

20 Claims, 16 Drawing Sheets

Transition Steps

|  | DC gain matched | DC gain unmatched | Vos, r (vos, s=0) mV | e2r (e2s=0) % | ????? ? |
|---|---|---|---|---|---|
| INL < 1LSB | >75 | >150 | 3 | good |  |
| INL < 1LSB | 50 | >100 | 4.5 | <1.5 |  |

FIG. 23

CHARGE INTEGRATION SUCCESSIVE APPROXIMATION ANALOG-TO-DIGITAL CONVERTER FOR FOCAL PLANE APPLICATIONS USING A SINGLE AMPLIFIER

This application claims the benefits of the U.S. Provisional Application No. 60/023,195, filed on Aug. 5, 1996, and is a continuation-in-part of U.S. patent application Ser. No. 08/744,955, filed Nov. 7, 1996, now U.S. Pat. No. 5,793,322 entitled "SUCCESSIVE APPROXIMATION ANALOG-TO-DIGITAL CONVERTER USING BALANCED CHARGE INTEGRATING AMPLIFIERS", the disclosure of which is incorporated herein in its entirety.

STATEMENT AS TO FEDERALLY SPONSORED RESEARCH

The invention described herein was made in the performance of work under a NASA Contract and is subject to the provisions of Public Law 95.517 (35 U.S.C. 202) in which the contractor has elected to retain title.

FIELD OF THE INVENTION

The invention is related to analog-to-digital converters. More specifically, the present invention defines a charge integration successive approximation analog-to-digital converter for focal plane applications using a single amplifier.

BACKGROUND AND SUMMARY OF THE INVENTION

There are many applications for analog-to-digital converters. Real world analog information must be converted into a digital form before it can be processed by digital devices such as computers.

There are a number of types of analog-to-digital converters employing various conversion methods. Each of these methods offer different performance characteristics and trade offs between operating speed, power consumption, achievable accuracy, chip area, required amplifier gain, bandwidth, impedance matching and noise.

Conventional electronic systems often package analog-to-digital converters (ADCs) on a separate integrated circuit. Generally, increased electronic integration offers a number of advantages. Hence it is desirable to integrate ADCs onto existing integrated circuit chips. This would reduce the total mass, volume, and system power, as well as the number and volume of power supplies in many systems. An indirect benefit would include a lowering of system design time and design error rate.

One example of an application for such integrated analog-to-digital converters is in the field of semiconductor imagers. There have been recent efforts to implement on-chip ADCs onto detector arrays, such as focal-plane arrays (FPAs). Typically, signal chains introduce noise in focal-plane arrays. Therefore, besides the above-described advantages of integrating ADCs, an FPA system with an on-focal-plane (on-chip) ADC would be expected to exhibit superior noise performance. This is due to the inevitable introduction of unwanted noise through cross-talk, clock pickup, power supply noise, electromagnetic interference (EMI) and other mechanisms. Since the serial data rate in the signal chain is typically the highest rate in the entire imaging system, white noise is introduced with a maximum bandwidth. Clock noise and other capacitively-coupled noise sources are also known to increase with increasing data rates.

On-chip ADCs would operate at a significantly lower bandwidth, ameliorating these effects. Since no off-chip analog cabling is required, pick up and vibration sensitivity would also be eliminated. More fundamentally, multiple sampling, or over-sampling, of the detector signal can be more effectively performed on the focal plane as compared to off-chip. Thus, an on-chip ADC would eliminate mechanisms for the introduction of noise, as well as permit increased signal-to-noise ratio through over-sampling techniques. On-focal-plane ADCs can also lead to a reduction in total FPA power dissipation.

Furthermore, digital signals can be digitally processed on-chip as a further level of integration. For example, on-chip digital signal processing can be used for autonomous sensor control, e.g. exposure control, or for control, of windowed region-of-interest readout. Image compression can also be achieved on-chip to reduce off-chip drive requirements.

The incorporation of high resolution ADCs on focal-plane arrays has proved to be a difficult challenge. There is much less silicon area available on focal-plane arrays than on stand-alone ADCs. An ADC with serial architecture would be required to operate with the highest bandwidth of all focal-plane components, since the conversion rate would be the same as the pixel data rate. In a scientific application, a typical pixel data rate is about 100 KHz. In defense applications and in certain scientific applications, data rates in excess of 100 MHZ are often required. The reliability of CMOS at such high data rates circuits is also a concern.

These problems are compounded in scientific applications which routinely require resolutions greater than sixteen bits. This level of resolution generally requires over-sampling techniques that drive the ADC clock rate even higher. On-chip ADCs would also increase focal-plane power dissipation because of the required high speed operation of several analog circuits; compared to the single driver amplifier used in conventional focal-plane readouts. For these reasons, the inventors believe that a serial on-focal-plane ADC architecture would not be optimal.

Another alternative is a massively parallel architecture; for example, with one ADC on each readout pixel in the focal-plane array. However, only a relatively small area is available for most applications; typical pixel size is about 30 $\mu m^2$. Thus, this does not leave enough room for conventional ADC approaches which require a relatively larger chip area.

In summary, speed limitations in serial architectures and area limitations in parallel architectures have restricted the implementation of on-focal-plane ADCs. The present inventors have recognized that the use of a semi-parallel architecture can be expected to preserve the advantages, and mitigate the adverse consequences, of both of these architectures. A semi-parallel architecture would, for example, utilize an ADC for every column of the readout. This affords few problems with area in one dimension and tight, but feasible, design space in the other dimension based on the degree of integration of the columns. Such tall, skinny, ADCs would operate, in parallel, on one row of image data at a time.

A number of ADC techniques are available for use in focal-plane applications. These conversion methods differ from each other in terms of operating speed, power consumption, achievable accuracy, and chip area. An important difference between on-focal-plane ADC and a single chip monolithic ADC, is that an on-focal-plane ADC must occupy a relatively small chip area. The real estate becomes an even more serious concern for column-parallel approaches. Due to the unavailability of a large chip area, focal-plane ADCs cannot usually take advantage of elaborate trimming techniques for resolution enhancement. Thus, the immunity of the ADC performance to circuit parameter mismatch is a problem.

Low power operation is preferred in focal-plane ADCs. Maximum overall power dissipation in the combined ADCs would typically be limited to between one and 20 mW. The required resolution and conversion rates vary widely depending upon applications. The conversion rate depends on the array size, the integration time, and the choice of ADC architecture. The rate is usually in the range of 1 KHz to 1 MHz. Scientific infrared imagers usually demand high resolution (greater than sixteen bits), but several other applications require only eight to ten bit accuracy. Thus there is a wide range of operating requirements. Conversion rate requirements vary from 1 kHz to 1 MHz, and the bit resolution requirements vary from six to over sixteen bits. There does not appear to be a single ADC algorithm that optimally meets all of these widely varying requirements.

Candidate ADC algorithms which meet some of these constraints include flash ADCs, successive approximation ADCs, single/dual slope ADCs, and over-sampled delta-sigma ADCs. For ADC operation in the two to ten bit range, the inventors have recognized that the successive approximation ADC is an attractive alternative for focal-plane applications. This kind of ADC achieves high resolution at medium speeds and with minimal power dissipation. One advantage with successive approximation is that for n bits, only n comparisons need to be made. This results in high speed and low power dissipation. Furthermore, this architecture does not require excessive chip area.

The successive-approximation analog-to-digital conversion process is essentially a "ranging" algorithm. Each conversion step estimates the upper and lower bound within which the input voltage lies. The analog voltage is approximated to within a small error by successively shrinking these bounds. The ranging can be done in several ways. One successive-approximation algorithm that is compatible with CMOS implementation is described in S. Ogawa, et al., "A switch-capacitor successive-approximation A/D converter", IEEE Trans. Instrum. and Meas., Vol. 42, pp. 847–853, 1993. One disadvantage with that approach is that the residual voltage decimates to approximately $V_{ref}/2^n$ after n conversion steps. As a result, the ADC can become susceptible to circuit noise, offset and non-idealities.

It is hence an object of the present invention to overcome these disadvantages in order to realize many of the potential advantages of on-focal-plane ADC. It is also an object of the invention to provide an ADC which requires reduced chip area and power consumption. It is further an object of the invention to provide an ADC with a superior match in DC gain and DC offset, and a minimal ADC error caused by the DC gain. This is done according to the invention by the use of a charge integration successive approximation ADC using a single amplifier. In particular, the invention uses a single charge-integrating amplifier to implement charge balancing.

An initial signal to be digitized is converted to the charge domain using a capacitor. The charge is then transferred to a charge-integrating amplifier circuit. For a differential signal (such as pixel sample and reset outputs) the other side of the input signal is also converted to charge and put on the charge integrating amplifier circuit in the next step. A reference voltage is also converted to charge and divided, e.g., in half, using capacitors and a switch.

Respective storage capacitors are used to hold the resulting charge from the signal and reset levels, respectively. The signal and reset charge values are compared in a comparator and the divided reference charge is transferred to either a signal branch or a reset branch, both of which use a common charge integrating amplifier circuit, depending on which has the lesser signal. The remaining half of the reference charge is divided again. This results in two reference charges, each equal to one-fourth the original value. This process is continued for n bits resulting in n-bits of resolution. Each comparison represents a new bit in the output digital word, starting from the most significant bit. Each time the second branch is selected, a "one" is generated for the digital word.

Since only n comparisons are needed for n bits of resolution, the invention operates at high speed with low power dissipation. It is particularly well suited for focal-plane applications in the 2–10 bit range. In addition, the architecture utilizes a CMOS charge-integrating amplifier, resulting in an ADC well suited for CMOS compatible focal-plane applications. Furthermore, the architecture of the invention requires minimal chip area and is well suited to column-parallel on-chip focal-plane applications.

BRIEF DESCRIPTION OF THE DRAWINGS

These and other aspects of the invention will now be described in detail with reference to accompanying drawings, wherein:

FIG. 23 summarizes the tolerances for the error parameters.

DETAILED DESCRIPTION

Figure 1:
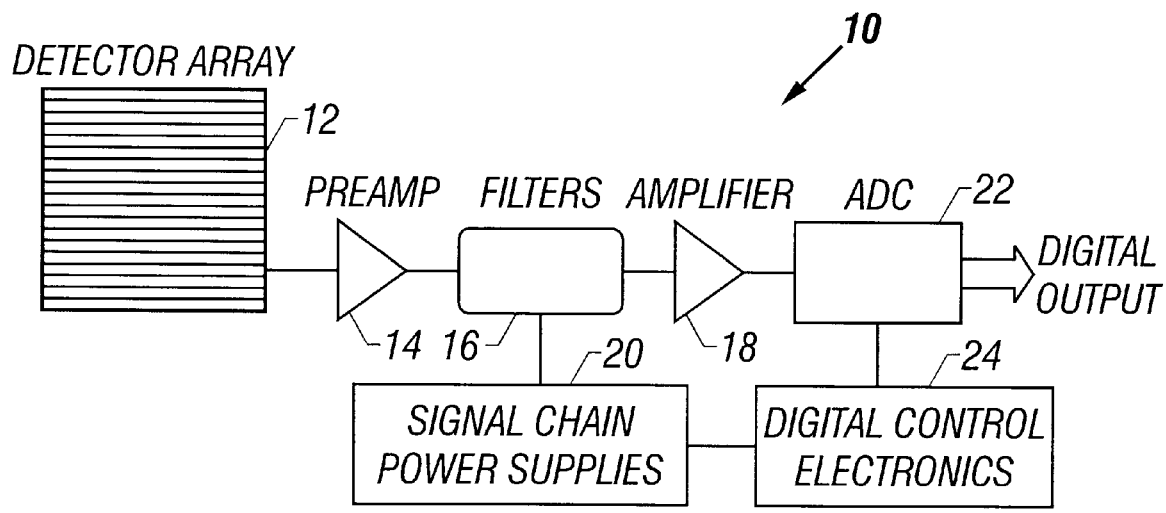
FIG. 1 shows a system signal chain for a focal-plane array imaging device with off-chip analog-to-digital converters.

FIG. 1 shows a conventional focal-plane array system with off chip analog-to-digital conversion. The focal-plane array system 10 includes a focal-plane array detector 12 which generates an analog output that is processed by a preamp 14, filter 16, and amplifier 18, all of which are powered by power supply 20. The output of the amplifier 18 is fed to a separate integrated circuit containing an analog-to-digital converter 22 which is controlled by digital control electronics circuit 24.

Figure 2:
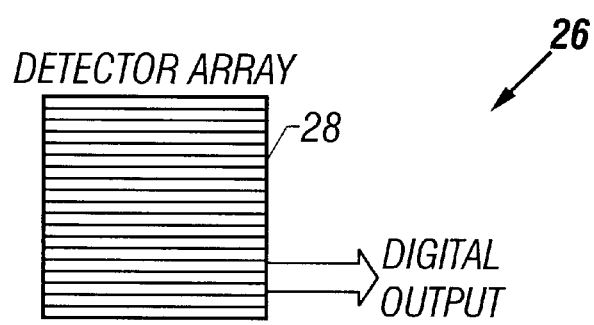
FIG. 2 shows a system signal chain for a focal-plane array with on-chip analog to digital converters.

The invention provides the multiple advantages of integrating analog-to-digital circuits onto a detector array chip by using the configuration shown in FIG. 2. The invention provides a focal-plane array system 26 that includes a detector array 28 having on-chip analog-to-digital conversion.

The functional equivalent of all of the off-chip circuitry shown in FIG. 1 is now included on the detector array chip. As a result, the array 28 itself can produce a digital output directly.

Active pixel sensors ("APS") represent a new generation of image sensor structures which include associated image processing structure on the chip.

Figure 3:
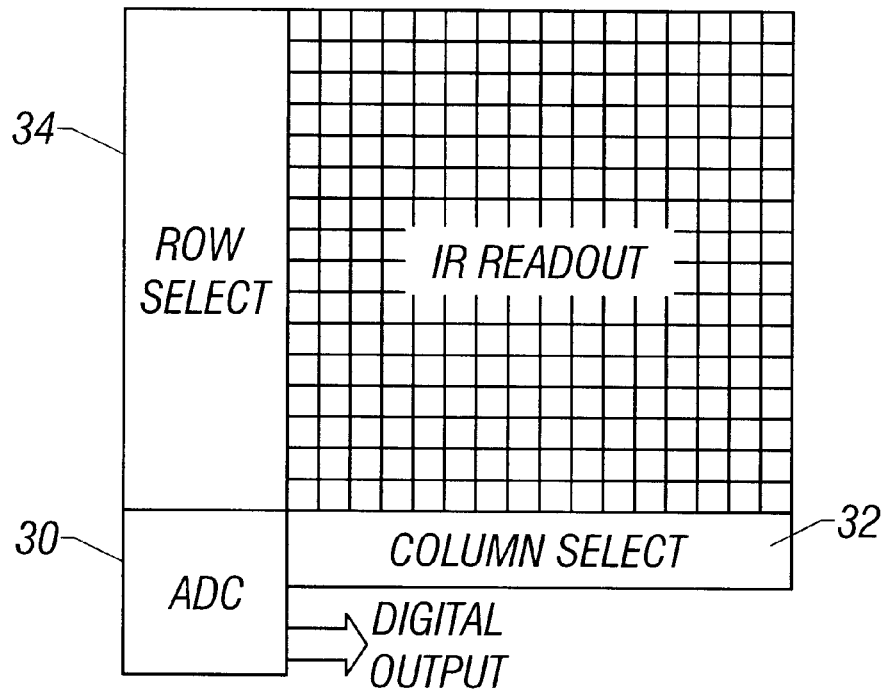
FIG. 3 shows the architecture for an on-focal-plane analog-to-digital converter employing serial architecture.

FIG. 3 shows one possible on-focal-plane analog-to-digital conversion architecture. It uses a serial analog-to-digital converter. This approach simply integrates a single analog-to-digital converter monolithically with readout electronics, including column select 32 and row select 34. However, this configuration cannot handle extremely high clock rates (such as one megahertz) without over-sampling techniques. High speed operation will also increase focal-plane power dissipation. Also, there is very little silicon area available for the high resolution analog-to-digital converter 30 that would be required with this architecture.

Figure 4:
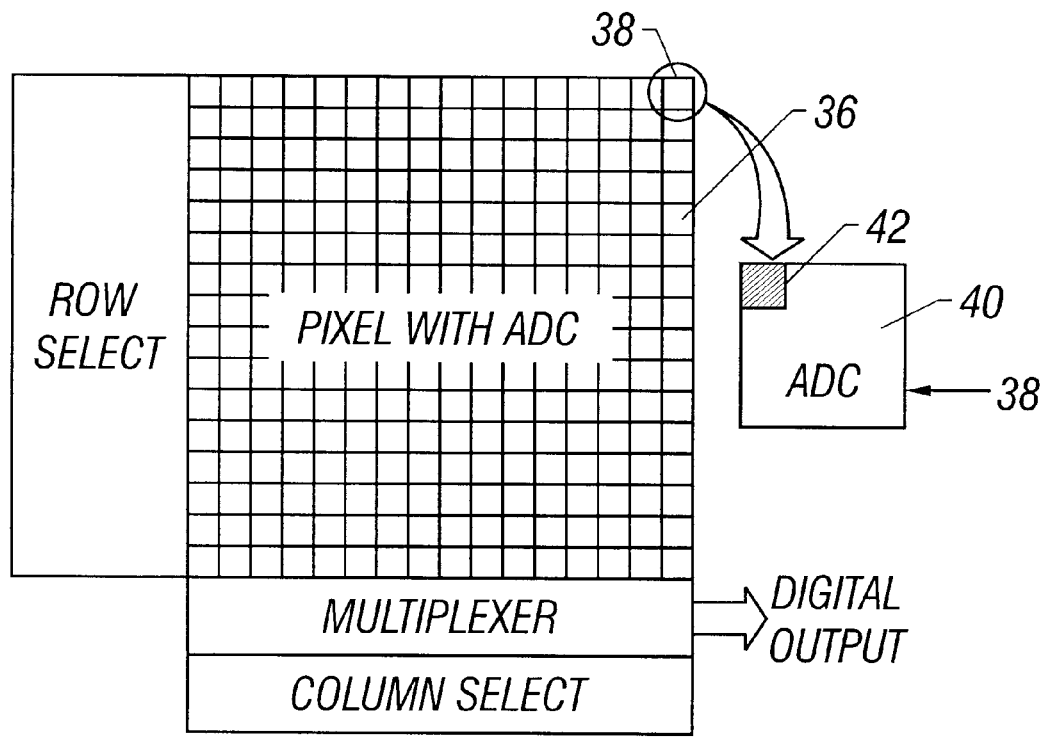
FIG. 4 shows an architecture for an on-focal-plane analog-to-digital converter employing a massively-parallel architecture.

Another alternative is to employ a single analog-to-digital converter for each pixel, as shown in FIG. 4. Here, each pixel 38 in the focal-plane array 36 includes both the analog-to-digital converter 40 and the readout electronics 42. This may not be feasible given the relatively small area available for most applications where the pixel size is typically 30 $\mu m^2$.

Figure 5:
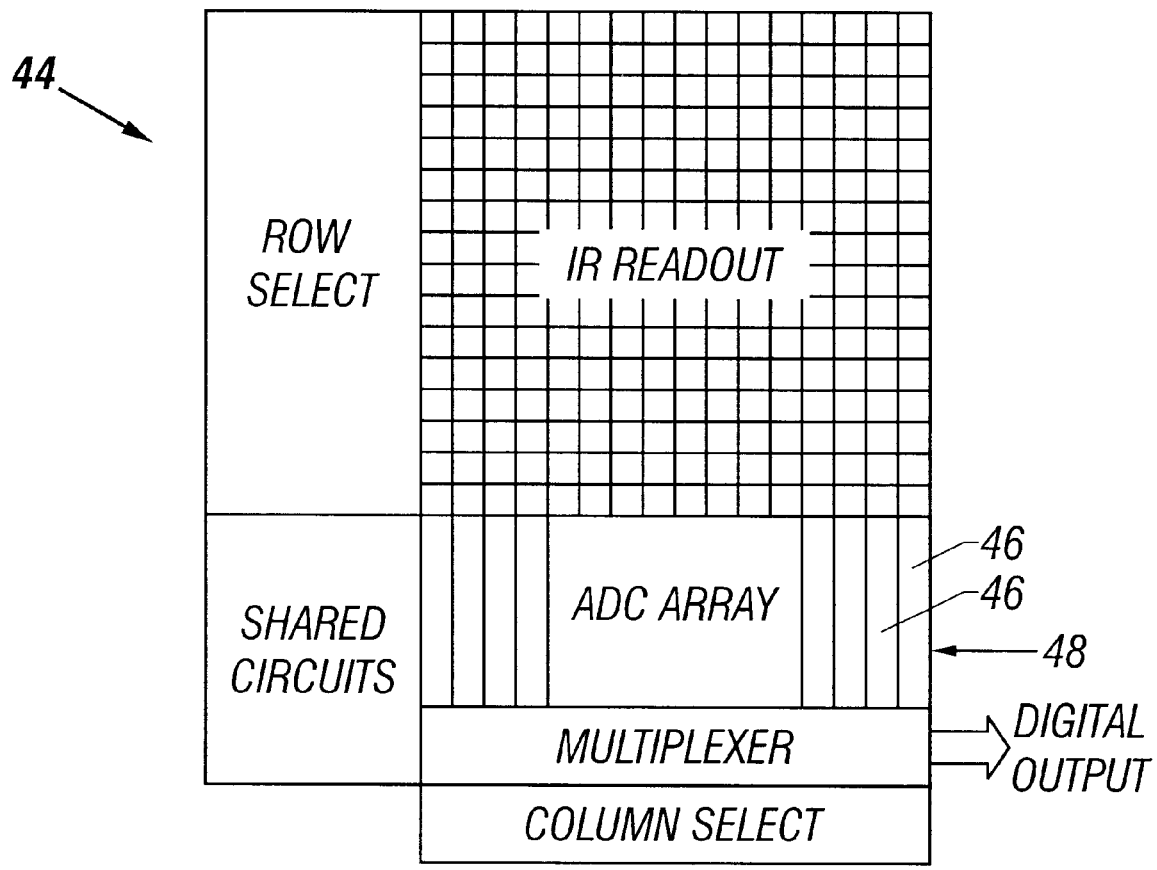
FIG. 5 shows an architecture for an on-focal-plane analog-to-digital converter employing column-parallel architecture.

The speed limitations of the serial architecture, and the area limitations of parallel architecture, can be mitigated by the use of a semi-parallel architecture such as the one shown in FIG. 5. The semi-parallel architecture focal-plane array system 44 employs individual analog digital converters 46 for every column of the readout. These individual analog-to-digital converters (ADCs) 46 form an analog-to-digital converter array 48. This design affords virtually unlimited chip area in one dimension and tight but feasible design space in the other dimension.

These ADCs 46 operate in parallel on a row of image data at one time. The conversion rate in this case is the row readout rate, which is 100–1,000 times slower than the serial pixel data rate. For example, for a 1,024 by 1,024 array having a serial pixel data rate of 50,000 pixels per second, the corresponding ADC data rate for a one ADC per column architecture would be just 50 pixels per second.

One alternative semi-parallel architecture is to employ a single ADC for multiple columns, where the number of columns sharing an ADC is small, such as 32. This derivative architecture would require submultiplexing of the multiple columns to the ADC. This affords more design area in the transverse direction at the expense of increased data rate.

Semi-parallel architecture also affords a relatively low power operation. This is due to the fact that, unlike digital circuits, power dissipation in analog circuitry depends super-linearly on the operating frequency. As a result, the total power dissipation for a semi-parallel architecture can be lower than for a serial architecture for the same pixel data rate.

Additionally, the semi-parallel architecture allows the use of "shared circuits", i.e., a single circuit block (e.g. reference generator) can serve the entire ADC bank. This can also lead to considerable power and area saving. Since the conversion rate is lower than that in a serial architecture, the analog circuits may be biased in sub-threshold, affording further reduction in power.

One concern, however, is the matching of the ADC characteristics between the columns. A lack of matching can generate fixed-pattern noise in the output data. Fixed pattern noise can be reduced by using well-known techniques such as "double delta sampling". This involves storing the reset level and the signal level on separate capacitors and performing correlated double sampling.

The present invention employs a successive approximation algorithm for implementing on-chip ADC. The invention may operate directly in the charge regime, or may employ voltage-to-charge converters to convert an input voltage to charge prior to performing charge balancing. The charge regime may be advantageous if the input device is an active pixel sensor, a charge-coupled device, and so on. The successive approximation concept is well-known in the art. In general, successive approximation operates by making incremental guesses, where each guess is incremented by $\frac{1}{2}^n$ where n is the iteration number. For example, if it is desired to convert an analog voltage between zero and one volt to a digital signal, a guess of one-half volt is made. That value is compared against the input. If the input is 0.7 volts, a higher guess should be made. The next guess would be one-half (the first guess) plus one half of the first guess (=one-fourth volts ($\frac{1}{2}^{n=2}$)), or 0.75 volts. This is too high. So the next guess is one-half+one-fourth minus one-eighth ($\frac{1}{2}^3$) volts (0.125 volts) or 0.625 volts. This is too low, so the next guess is one-half plus one-fourth minus one-eighth plus one-sixteenth volts ($\frac{1}{2}^4$), or 0.6875 volts. Again, this is too low so the next guess is one-half plus one-fourth minus one-eighth plus one-sixteenth plus one-thirty-second ($\frac{1}{2}^5$), or 0.7188 volts. Each iteration represents one bit of resolution. This process continues until the desired number of bits is read out.

There are many ways to implement successive approximation. Chip area and power are a paramount concern for image sensor applications. With the present invention, the inventors have found a technique for implementing successive approximation analog-to-digital conversion in a manner which utilizes minimal chip area and power. Thus it is particularly well-suited to image sensor applications. It is particularly well suited for a column-parallel architecture having an analog-to-digital converter array on-chip, where the analog-to-digital converter processes data from one or more columns.

A preferred charge balancing approach is described herein which accomplishes this by successively accumulating charge on two branches of a circuit called a signal branch and a reset branch. The circuit attempts to balance the signal on the two sides. For example, assume that an input signal is represented by 0.7 units of charge on the "A" branch of a circuit. The circuit "B" branch is initially set to no charge. The signals on the two branches are compared. A charge-to-voltage converter samples the charge and the two sides are compared using a voltage comparator. The branch with less charge, here "B", is selected by the comparator. Charge Max/$2^1$=one-half unit of charge is added to that side. The two branches are again compared, and again, the "B" branch is selected. Charge Max/$2^2$=one-fourth unit of charge is added to the "B" branch. The branches again are compared. This time the "A" branch is found to have less charge (0.7 v. 0.75). Charge Max/$2^3$=one-eighth unit of charge is added to the "A" branch. Now the "A" branch has 0.825 units of charge and the "B" branch has 0.75 units. Again, the branches are compared and the "B" branch is found lacking, so one-sixteenth unit of charge is added to that side. The process is continued until n comparisons are performed. Each comparison represents a new bit in the output digital word, starting with the most significant bit. Each time the "B" branch is selected, a "one" is generated for this digital word.

This charge balancing approach may be implemented in a CMOS circuit employing charge integrating amplifiers. If the input signal is digital, the same is converted to the charge domain using a capacitor. The charge is then transferred to the "A" branch of a charge-integrating amplifier circuit. If the input signal is differential, then the other side of the signal is also converted to charge and put on the "B" branch using a second charge-integrating amplifier circuit.

Figure 6:
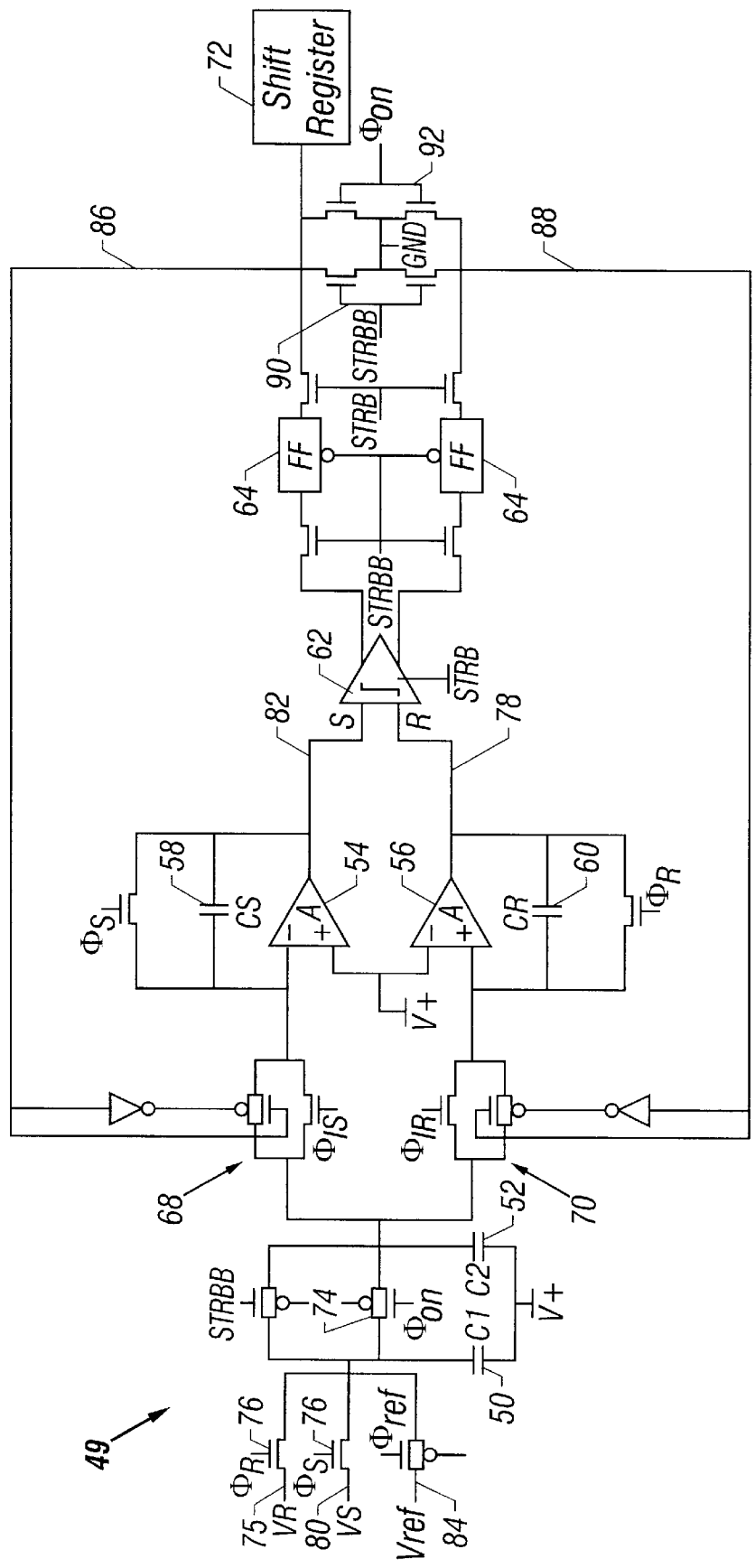
FIG. 6 shows a charge balancing successive approximation ADC using two charge-integrating amplifiers.

Referring to FIG. 6, which may be, e.g., an ADC for a focal plane pixel output, a reference voltage is converted to charge, and split in half using two capacitors 50 and 52 and a switch 74. The "A" and "B" branches are compared and the one-half reference charge is transferred to the branch with the lesser signal. The remaining half of the reference charge is again split into one-fourth of the reference charge. The branches are again compared and the charge is transferred again to the branch with the lesser signal. The process is continued for n bits. Each comparison represents a bit in the output digital word where a "one" is generated each time the "B" branch is selected.

The above method, employing balanced charge integrating amplifiers, has at least the advantage of reducing the gain requirement for the op-amps used. This construction results in several requirements, however, as discussed in detail below. Briefly, in using two separate op-amps for the different branches, there is an inherent requirement that the gain of the op-amps should be matched. Further, the DC offsets of the op-amps should be matched. If the DC offsets are unmatched, the ADC may become nonlinear. The matching of the op-amps becomes more important when the op-amp's gain is not very high. As an example, if the op-amps' offset is 20 mV and is not otherwise corrected, the error may be as high as 4 bits or even higher.

ADC 49 has two sample and hold capacitors 50, 52 (C1 and C2), two charge integrating amplifiers comprising charge transimpedance integrating amplifiers (CTIAs) 54, 56 which accumulate charge in their respective feedback capacitors 58, 60 (CS and CR). A strobe comparator 62 compares its inputs. Two flip flops 64, 66 are used for buffering the digital output feedback to a pair of CTIA input switches 68, 70. A shift register 72 stores the bits forming the output digital words.

Figure 7:
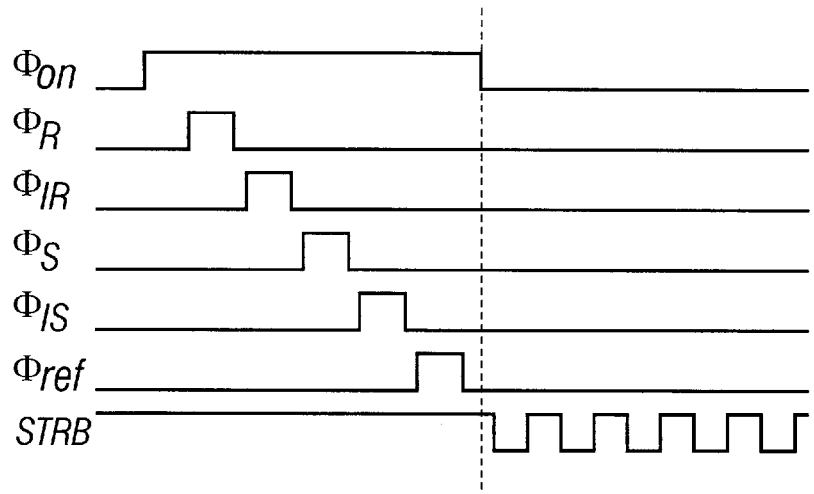
FIG. 7 shows a clock diagram of the circuit operation of the ADC in FIG. 6.

The operation of the converter is shown in the timing diagram of FIG. 7. In a first phase, the analog readout and charge transfer process occurs. Initially, an input switch 74 is switched on ($\Phi_{on}$) to allow analog inputs to be converted to charge in capacitors 50 and 52. The reset level 75 of the focal-plane pixel output is then sampled onto the sampling capacitor pair 50, 52. This is accomplished by setting switch 76 high ($\Phi_R$) which is connected to the reset output of the focal plane array. The charge is then transferred from the capacitor pair 50, 52 onto the reset CTIA feedback capacitor 60 thereby directing the reset level charge to one of the comparator inputs 78. This is done by setting switch 70 high ($\Phi_{IR}$).

Similar readout procedures are used to direct the signal level of the pixel output to the other input node of the comparator 62. In particular, switch 80 is set high allowing the VS signal pixel output to be transferred to the sampling capacitor pair 50, 52. CTIA input switch 68 ($\Phi_{IS}$) is then turned on to transfer the charge from the capacitor pair 50, 52 to the sample CTIA feedback capacitor 58. As a result, the sample charge is directed to the sample input 82 of the comparator 62. The reference voltage $V_{ref}$ is then sampled onto the capacitor pair 50, 52 using the reference voltage switch 84 which is connected to the $V_{ref}$ input ($\Phi_{REF}$). The analog readout and charge transfer process is now complete and $\Phi_{on}$ is hence turned low using switch 74.

The operation now proceeds to a second, conversion, phase. This begins by activating the comparator 62 control signal "strobe" (STRB). The comparator 62 compares the signal and reset levels at its inputs 82, 78. Its outputs are used to activate the input of one of the CTIA amplifiers 54, 56. This determines the branch for the specific charge package on capacitor 52 (C2) is to be transferred.

The comparator output feedback elements 86 and 88 and flip flops 64, 66 are arranged in such a way that they will turn on the CTIA input switch 68, 70 that is on the higher voltage side. The reference voltage 84 is chosen to be higher than V+ by an amount equivalent to the sensor saturation.

The analog readout scheme described above is such that the signal level is always lower than the reset level at the top of the capacitor pair (C1 and C2), while both are lower than the bias voltage V+, which is chosen to be two volts in this embodiment. After each charge transfer, the voltage level will flip to a symmetrical counterpart relative to the bias voltage level, V+. As a result, at the input nodes of the comparator, the initial signal level is always higher than the reset level.

In each conversion step, the higher voltage at the comparator input nodes 78, 82, will be reduced by a binary weighted voltage, while the voltage at the lower node stays the same. The higher voltage is selected and reduced by the binary weighted voltage. Alternatively, the lower voltage could be selected, and then increased by the binary weighted voltage. The result in either case would be the same.

The conversion technique is depicted by the following equations:

$$V_{S,i} = V_{S,i-1} - b_i \frac{V_{ref}}{2^i}$$

$$V_{R,i} = V_{R,i-1} - \bar{b}_i \frac{V_{ref}}{2^i}$$

where $$b_i = \begin{cases} 0 \text{ for } V_{R,i-1} \text{ greater than } V_{S,i-1} \\ 1 \text{ for } V_{R,i-1} \text{ less than } V_{S,i-1} \end{cases}$$

If the CTIA ops-amps 54, 56 are mismatched in gain or DC offset, for example, as described above, the ADC may become nonlinear. The effect of op-amp mismatch, in both the gain and the DC offset, is estimated as follows.

Figure 8:
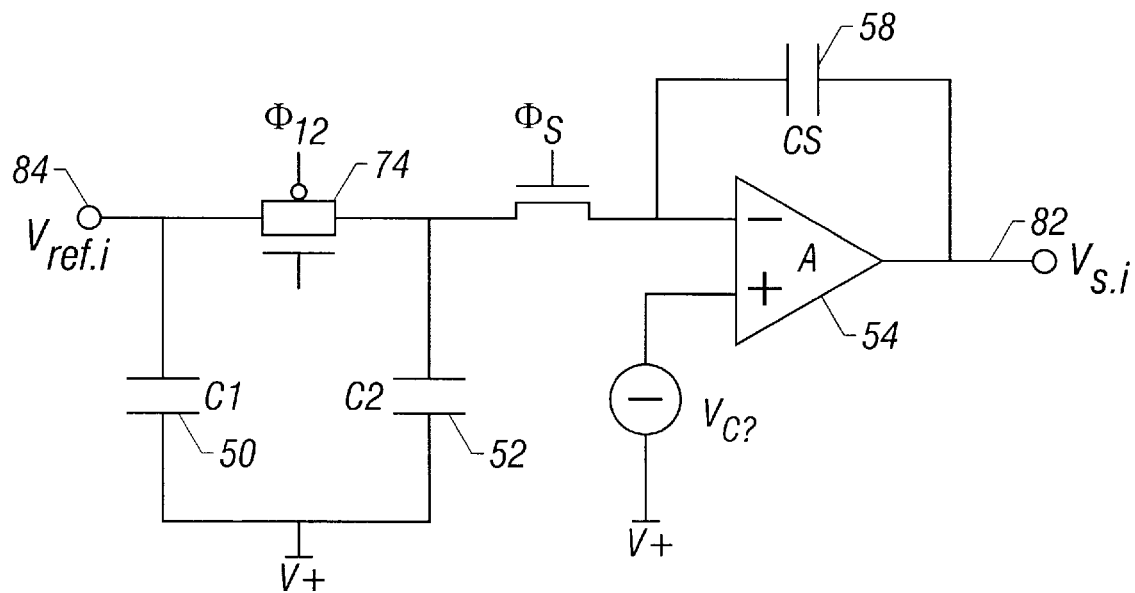
FIG. 8 is a circuit diagram of one side of a two-sided successive approximation ADC.

The signal side of the CTIA is shown in FIG. 8 for purposes of illustration. For convenience, the operation clock frequency is assumed to be low enough that a DC analysis is sufficient for the DC characteristics to be estimated.

At the I-th step of charge sharing, $\Phi_{12}$ (switch 74) is off, leaving $V_{ref,i}$ at the top of C2 52. $\Phi_S$ is turned on, and the I-th step of integration transfers the charge from C2 52 to CS 58. The voltage at the output of the integrator $V_{si}$ (on line 82) is determined by the following equation:

$$\left(-\frac{V_{S,i-1}}{A_S} + V_{OS,S} - V_{S,i-1}\right)C_S + C_2 V_{ref,i} = \left(-\frac{V_{S,i}}{A_S} + V_{OS,S} - V_{S,i}\right)C_S + \left(-\frac{V_{S,i}}{A_S} + V_{OS,S}\right)C_2$$

Solving for $V_{s,i}$, the following iteration relation is obtained:

$$V_{S,i} = \frac{-\frac{C_2}{C_S}}{1 + \frac{1}{A_S}\left(1 + \frac{C_2}{C_S}\right)}(V_{ref,i} - V_{OS,S}) + \frac{1 + \frac{1}{A_S}}{1 + \frac{1}{A_S}\left(1 + \frac{C_2}{C_S}\right)} V_{S,i-1}$$

Which reduces to the charge transfer equation for an ideal integrator where $A_s = \infty$ and $V_{OS,S} = 0$:

$$V_{S,i} = -\frac{C_2}{C_S} V_{ref,i} + V_{S,i-1}$$

If the charge transfer is incomplete, e.g., in the I-th step, then a small amount of charge will remain on capacitor C2 after the integration period. This small amount is proportional to $(-V_{S,i-1}/A + V_{OS,S})$. When the next reference voltage $V_{ref,i}$ is generated, this residual charge on C2 contributes to the charge sharing between C1 and C2. This results in a nonideal reference voltage generation. For example, where the I-th integration is on the signal side, the following relation is obtained:

$$\left(-\frac{V_{S,i-1}}{A_S} + V_{OS,S}\right)C_2 + V_{ref,i-1} C_1 = V_{ref,i}(C_1 + C_2)$$

from which the I-th reference voltage is:

$$V_{ref,i} = \frac{C_1}{C_1 + C_2} V_{ref,i-1} - \frac{C_1}{C_1 + C_2}\left(\frac{V_{S,i-1}}{A_S} - V_{OS,S}\right)$$

Defining $K_{12} = C2/C1 = 1 - e_{12}$, where $e_{12}$ represents a small deviation of the ratio from unity. Considering that the integration prior to a reference voltage generation can occur on both sides, the above equation for $V_{ref,i}$ can be written as:

$$V_{ref,i} = \frac{1}{1 + K_{12}} V_{ref,i-1} - \frac{1}{1 + 1/K_{12}} \Gamma_i$$

where $$\Gamma_i = \begin{cases} \frac{V_{S,i-1}}{A_S} - V_{OS,S} \text{ if } V_{S,i-2} \geq V_{R,i-2} \\ \frac{V_{R,i-1}}{A_R} - V_{OS,S} \text{ if } V_{S,i-2} < V_{R,i-2} \end{cases}$$

Using the equations above, a FORTRAN simulation of a successive approximation scheme was run. The nonlinearity of the converter was computed as a function of the op-amp finite gains ($A_S$ and $A_R$), non-zero DC offsets ($V_{OS,S}$ and $V_{OS,R}$), and mismatch error $e_{12}$ between C1 and C2, $e_{2s}$ between 2C2 and CS, and $e_{2r}$ between 2C2 and CR.

Figure 9A:
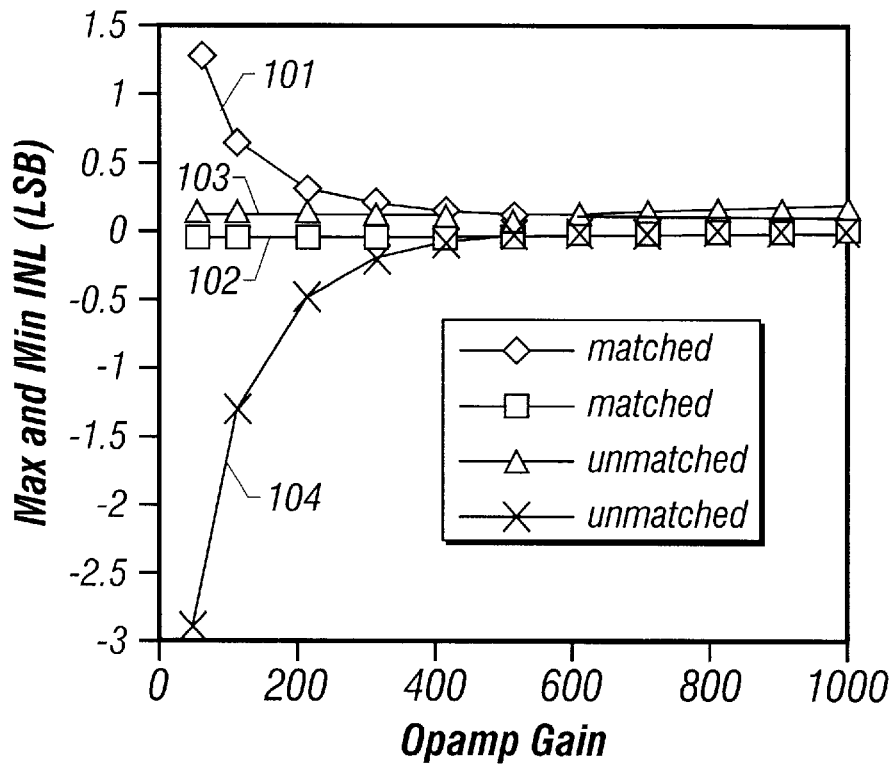
FIGS. 9A and 9B are graphs showing the nonlinearity of an ADC as a function of op-amp gain for both the matched and the unmatched case.
Figure 9B:
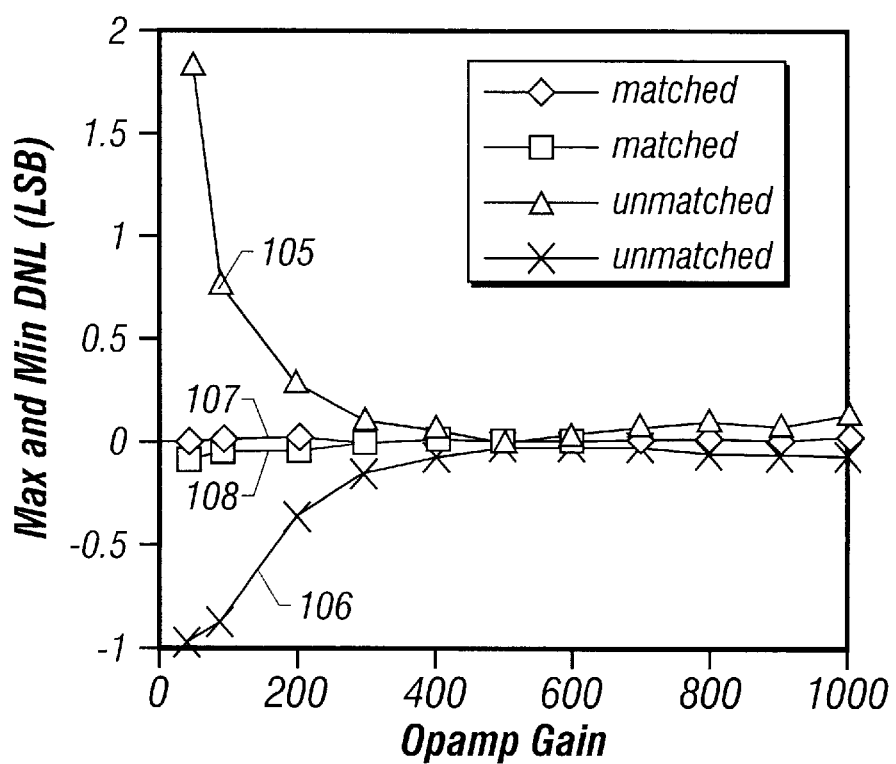

FIGS. 9A and 9B show the simulation results and, in particular, the maximum nonlinearity of the ADC as a function of the op-amp gains. With matched amplifiers, where $A_S = A_R = 50$, the maximum differential nonlinearity (DNL) (curve 107) is less than 0.1 times the least significant bit (LSB). The DNL is the deviation of the linearity from 1 LSB. The maximum integral nonlinearity (INL) (curve 101) is about 0.8 LSB. The INL is the deviation of the transfer function from the ideal straight line (i.e., the straight line between the endpoints of the transfer function). Thus, ADC has 8 bit accuracy.

With unmatched amplifiers, values of $A_R = 500$ and $A_S = 100$ were assumed. The maximum DNL (curve 105) is about 0.8 LSB. The maximum INL (curve 104) is about 1.2 LSB. Thus, the 8 bit accuracy is not retained even if the op-amp gains are both above 100.

However, if a substantially perfect match between the op-amps is achieved, a gain of 40 dB is sufficient for achieving an accurate 8 bit converter. Using similar reasoning, if a high gain op-amp is not available in a column-wise ADC design, the gain matching of the op-amps becomes more important.

Figure 10A:
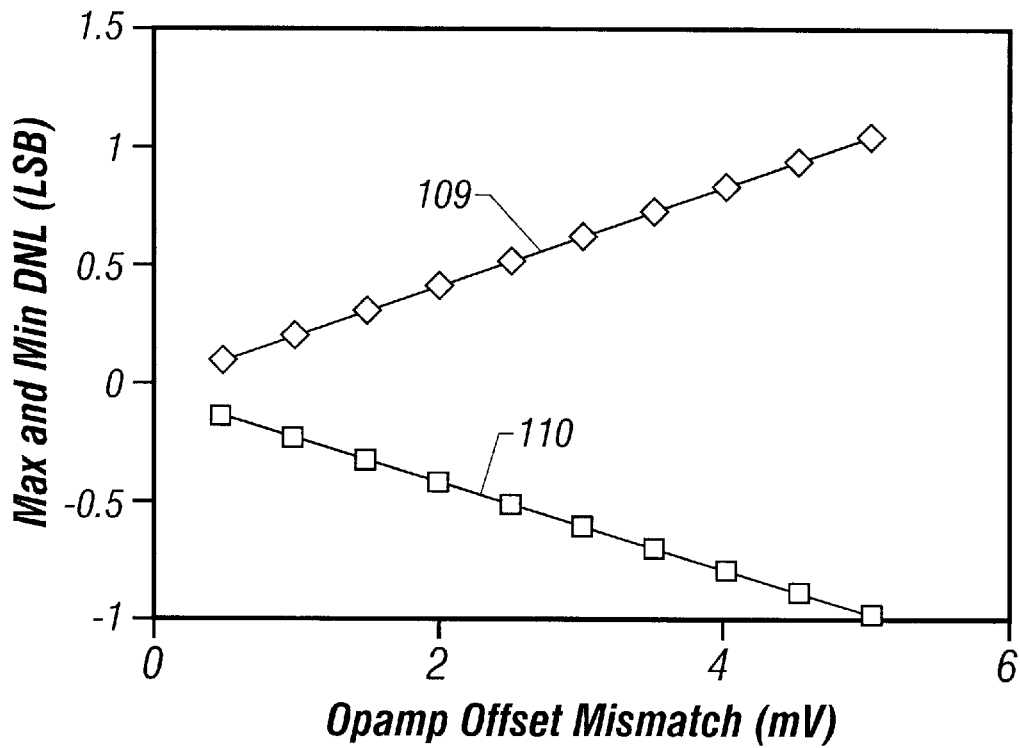
FIGS. 10A and 10B are graphs showing the nonlinearity of an ADC as a function of DC offset mismatch.
Figure 10B:
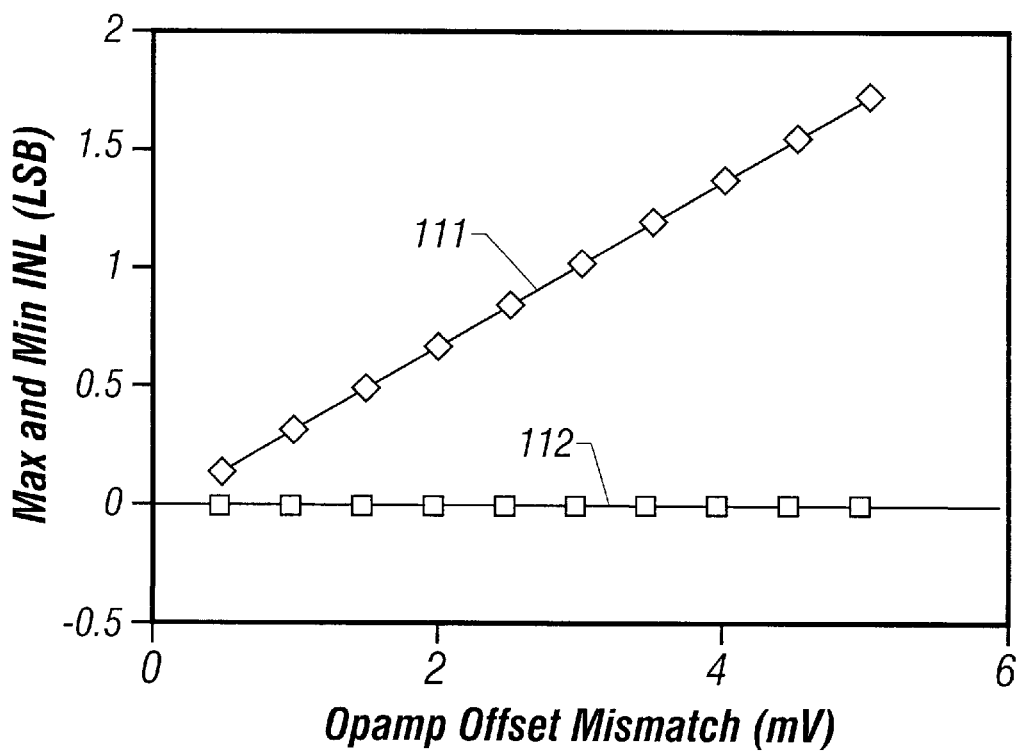

Another reason to match the op-amps is to minimize the ADC error caused by the DC offset. FIGS. 10A and 10B show this ADC error as a function of the DC offset mismatch. The simulation results show that, for a matched DC offset of 50 mV, the ADC INL is negligible (curve 112) and the ADC DNL is about 0.06 LSB (see curve 109), which is very small. On the other hand, assuming $V_{OS,S} = 0$, a 4.5 mV offset only on the reset side results in a nonlinearity (curve 109) of greater than 1 LSB in both DNL and INL.

A matched error of $e_{2r}$ and $e_{2s}$ causes negligible error for the ADC linearity. However, even a mismatched $e_{2r}$ and $e_{2s}$ is often negligible because the capacitor matching in currently-available CMOS technologies can be as good or better than 0.2%. FIG. 23 summarizes the tolerances for the error parameters in the design to achieve below 1 LSB ADC nonlinearity.

For the above reasons, the inventors discovered that superior results could be obtained by using a design employing a single op-amp for both the signal and the reset sides.

By sharing this op-amp, a perfect match was obtained in DC gain and DC offset. Further, the error caused by the DC gain was greatly reduced. The error caused by the DC offset is not necessarily small because this error depends strongly on the DC offset in cases where the DC gain is low.

Figure 11:
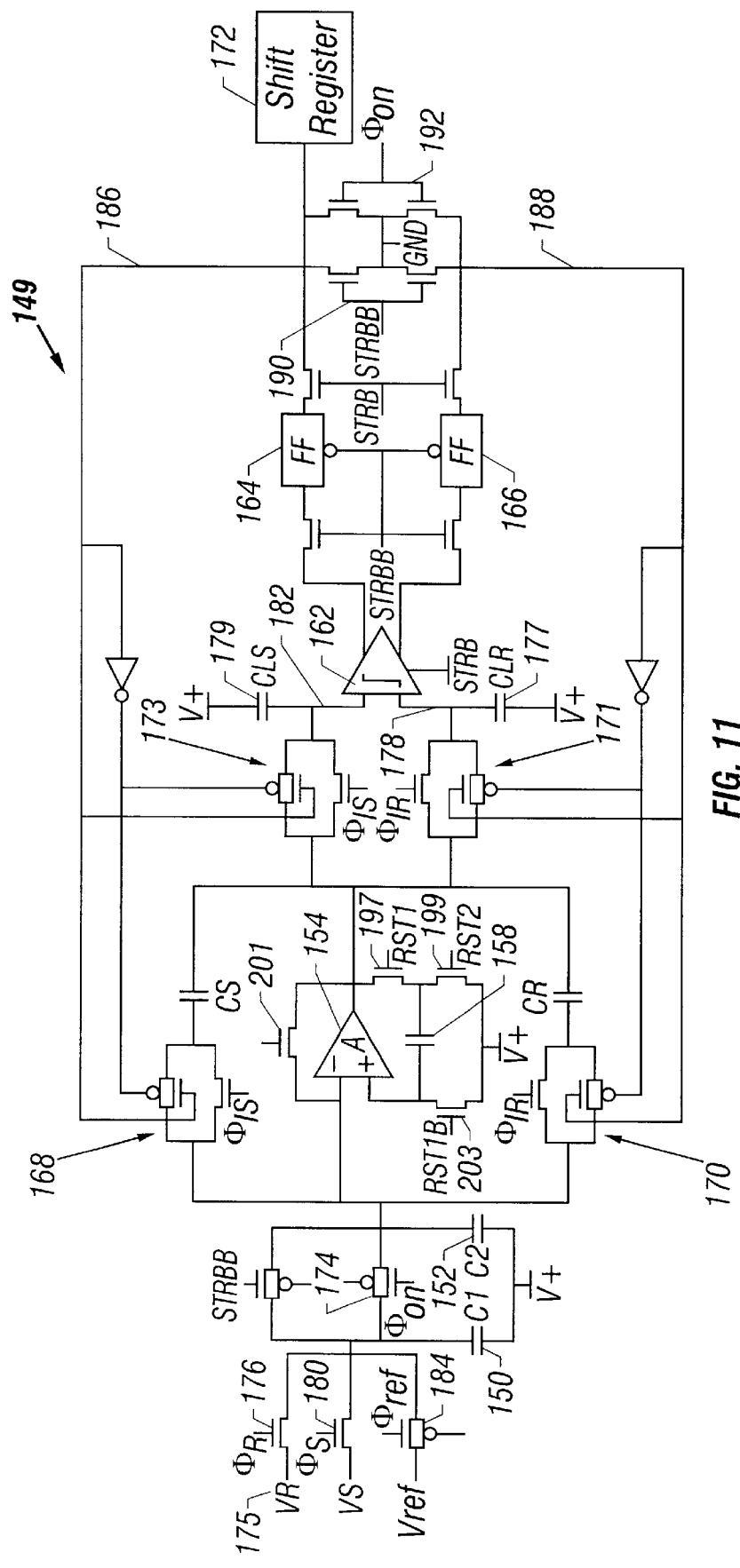
FIG. 11 is a circuit diagram of a charge balancing successive approximation ADC using a single charge-integrating amplifier according to an embodiment of the present invention.

FIG. 11 shows a circuit diagram of the ADC according to an embodiment of the present invention incorporating a single op-amp.

This circuit has two sample and hold charge storage elements such as capacitors 150, 152 (C1 and C2) but only one charge integrating amplifier comprising a charge transimpedance integrating amplifier (CTIA) 154 with a single feedback capacitor 158 (CC), and a strobe comparator 162. Two flip flops 164, 166 are used for buffering the digital output feedback to a pair of CTIA input switches 168, 170. A shift register 172 is provided to store the output digital words.

Figure 12:
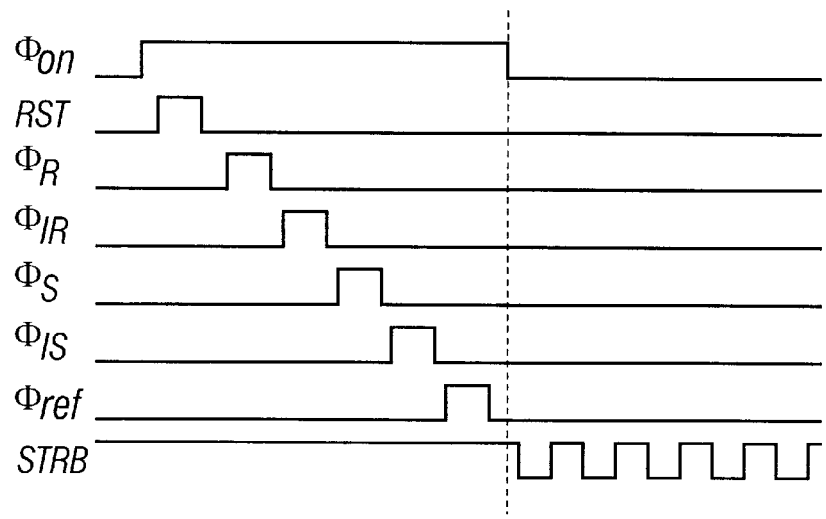
FIG. 12 shows a clock diagram of the circuit operation of the ADC in FIG. 11 of the present invention.

The operation of the converter is shown in the clock diagram of FIG. 12. In a first phase, the analog readout and charge transfer process occurs. Initially, an input switch 174 is switched on ($\Phi_{on}$) to allow analog inputs to be converted to charge in capacitors 150 and 152. The reset level 175 of a focal-plane pixel output is then sampled onto the sampling capacitor pair 150, 152. This is accomplished by setting switch 176 high ($\Phi_R$) which is connected to the reset output of the focal plane array. The charge is then transferred from the capacitor pair 150, 152 onto the CTIA feedback capacitor 158 directing the reset level charge to one of the comparator inputs 178. This is done by setting switches 170 and 171 high ($\Phi_{IR}$). The charge is held by a charge storage element such as capacitor CLR 177.

Similar readout procedures are used to direct the signal level of the pixel output to the other input node of the comparator 162. In particular, switch 180 is set high allowing the VS signal pixel output to be transferred to the sampling capacitor pair 50, 52. The charge is then transferred from the capacitor pair to the single CTIA feedback capacitor 158 by turning on CTIA input switch 168 ($\Phi_{IS}$) and switch 173. As a result, the signal charge is directed to the signal input 182 of the comparator 162. The change is held by a charge storage element such as capacitor CLS 179.

The reference voltage $V_{ref}$ is then sampled onto the capacitor pair 50, 52 using the reference voltage switch 184 which is connected to the $V_{ref}$ input ($\Phi_{REF}$). The analog readout and charge transfer process is now complete and $\Phi_{on}$ is hence turned low using switch 174.

The load of the integrator has be switched off when the integrator is charging the other branch or load bus. Therefore, capacitors CLS and CLR, as mentioned above, are required to hold the signal and reset levels at the input of the comparator. For the same power consumption, this single amplifier design may be slower than the double amplifier design because of the extra loading capacitance. By sacrificing speed when a specific application allows, mismatch is substantially eliminated and better ADC linearity can be achieved.

The operation proceeds to a second, conversion, phase. This begins by activating the comparator 162 control signal "strobe" (STRB). The comparator 162 compares the signal and reset levels at its inputs 182, 178. Its outputs are used to activate the input of one of the branches through switches 168 and 173 or through switches 170 and 171. This determines to which branch the specific charge package on capacitor 52 (C2) is to be transferred.

In particular, the comparator output feedback elements 186, 188 and flip flops 164, 166 are arranged in such a way that they will turn on the CTIA input switch 168, 170 that is on the higher voltage side. The reference voltage 184 is chosen to be higher than V+ by the amount of the sensor saturation.

The analog readout scheme described above is such that the signal level is always lower than the reset level at the top of the capacitor pair (C1 and C2), while both are lower than the bias voltage V+, which is chosen to be two volts in this embodiment. After each charge transfer, the voltage level will flip to a symmetrical counterpart relative to the bias voltage level, V+. As a result, the input nodes of the comparator always have an initial signal level which is higher than the reset level.

As before, in each conversion step, the higher voltage at the comparator input nodes 178, 182, will be reduced by a binary weighted voltage, while the lower ones stays the same. The higher voltage is selected and reduced by the binary weighted voltage in a subtraction circuit as shown. Alternatively, the lower voltage could be selected, and then increased by the binary weighted voltage. The result in either case would be the same.

Each binary-weighted referenced voltage is generated by the charge sharing between the two matched capacitors 150, 152 after the previous one is used in a charge transfer. For example, after the first step, the one-half $V_{ref}$ voltage capacitor 150 in C2 is transferred to the CTIA amplifier. The remaining one-half voltage in this capacitor is then shared by capacitors 50, 52. This results in each capacitor having a one-fourth $V_{ref}$ charge. In the next step, capacitor 152 will transfer its charge of one-fourth $V_{ref}$.

Figure 13:
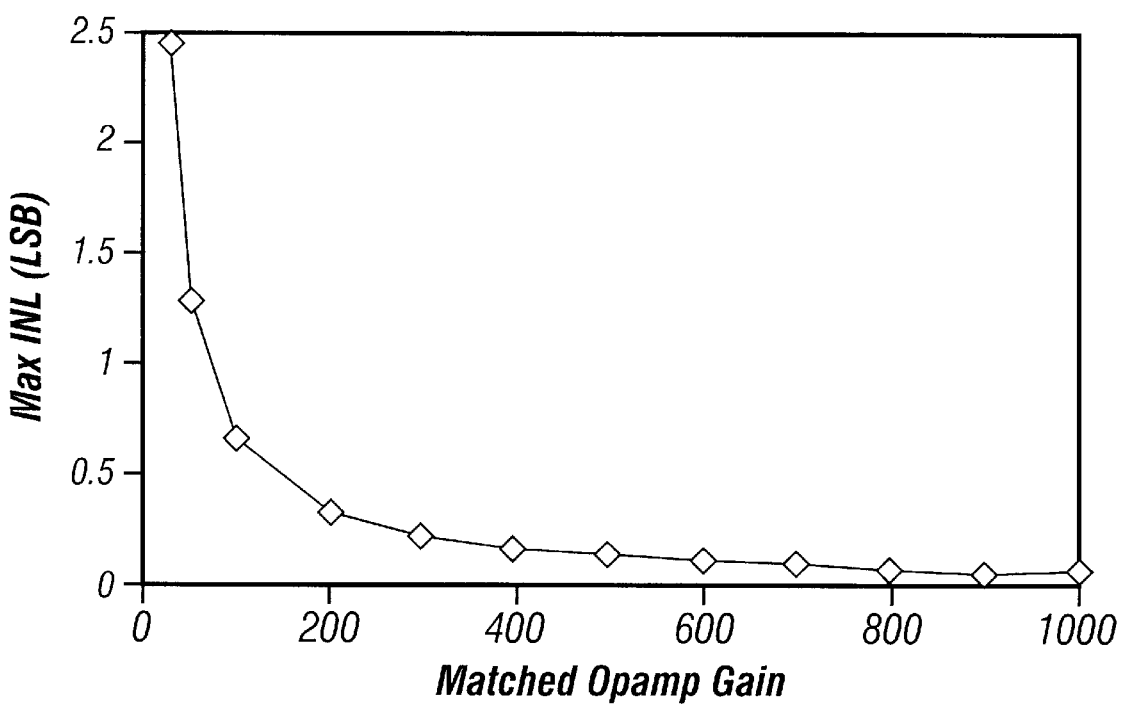
FIG. 13 is a graph showing the nonlinearity of an ADC as a function of op-amp gain for a matched DC offset of 5 mV.
Figure 14:
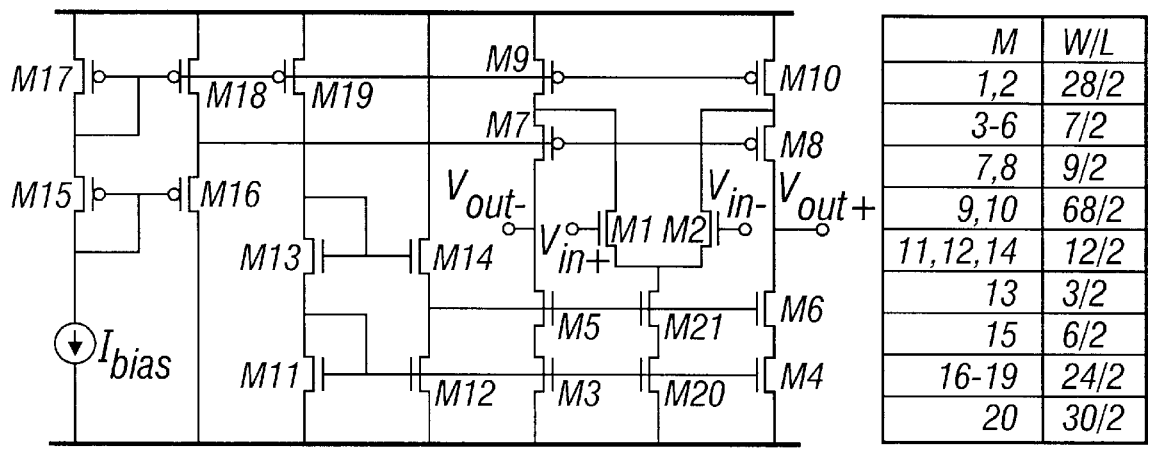
FIG. 14 is a block diagram of a folded cascode op-amp used in the charge-integrating amplifier circuit of the invention.

FIG. 13 shows the effect of a matched DC gain and matched DC offset as would occur using a single op-amp. In particular, the figure shows the maximum INL caused by a 5 mV matched DC offset as a function of matched DC gain. From the figure, a gain greater than about 100 is required to get 8 bit accuracy. The corresponding DNL is smaller than 0.1 LSB as long as the matched gain is above 50.

The offset of the op-amp 154 can be autozeroed by storing the offset in capacitor CC during an autozero phase. In this mode, switches rst1 (switch 197) and rst2 (switch 199) would be 'on' while rst (switch 201) is also 'on'. The offset is then compensated in the charge integration phase (here rst 1B (switch 203) is 'on' while rst, rst1, and rst2 are off). When the gain of the op-amp is low, the first order offset subtraction is not very accurate.

The operation of the different sections of the circuits of the ADC 149 can be synchronized by one clock signal "strobe" and its invert. As "strobe" becomes low, the charge transfer switches 168, 170 at the input of the CTIA are both off. By connecting the feedback lines 186, 188 to ground, the comparator output is fed into latches 190, 192. At the same time, charge sharing is performed between the matched capacitors 150, 152, generating the next reference voltage. When the "strobe" turns high, the charge partition switch 174 is turned off, the last words are fed to the charge transfer switches 170, 168 opening the side with the higher voltage so that the charge package on C2 is transferred to the feedback capacitor. This reduces the higher voltage by the desired fraction of $V_{ref}$.

Another cycle of conversion then follows. The same "strobe" signal can also be used to control the data transmission in the shift register 172. In practice, the different operations are timed in the right sequence, which makes the proper alignment of different control signals important. Non-overlapping clocks should be adopted to enhance the operation of the converter 149.

Two different op-amp designs may be used in the circuit for the CTIA 154. The folded cascode op-amp shown in FIG.

Figure 15:
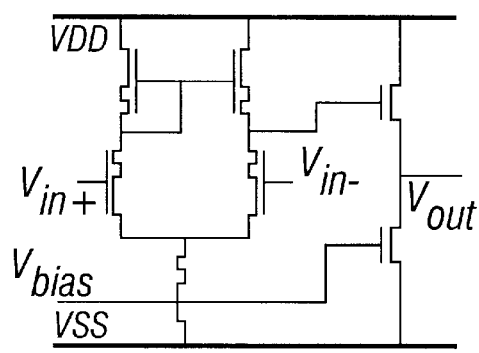
FIG. 15 is a block diagram of a self-cascode op-amp used with the invention.
Figure 16:
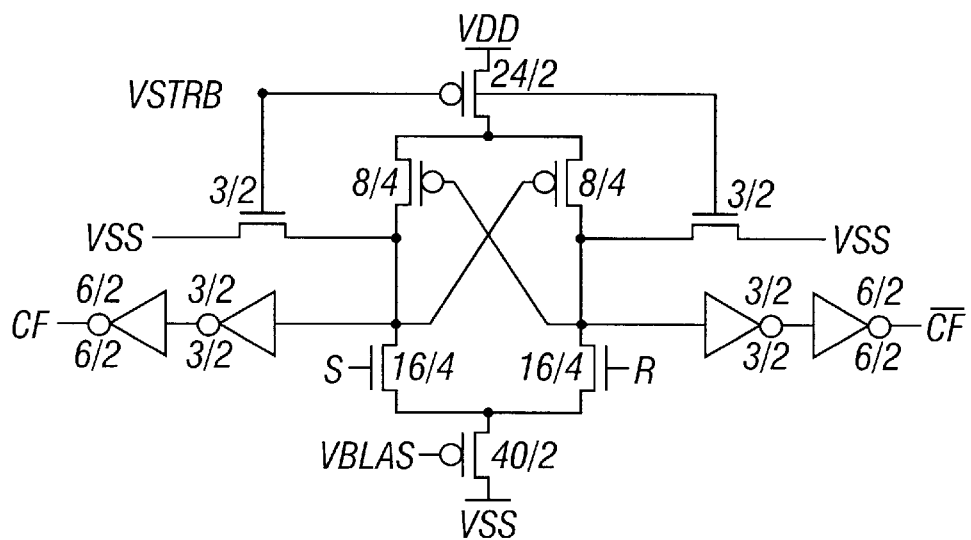
FIG. 16 is a schematic diagram of a strobe comparator used in the ADC of the invention.
Figure 17:
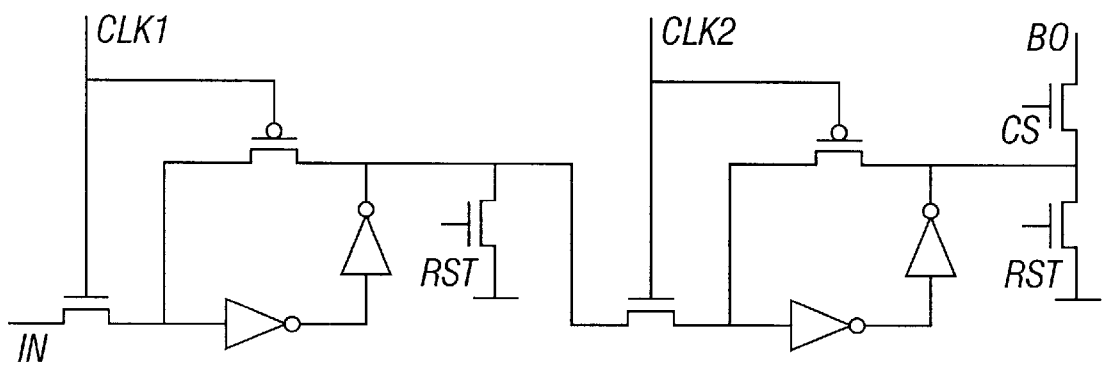
FIG. 17 is a block diagram of a unit cell of the shift register used in the invention.

14 is designed to have a DC gain of about 950. The other op-amp design used, shown in FIG. 15, is a self-cascode code op-amp which has a DC gain of about 500. In this amplifier, all the folded transistors are of size (width of gate/length) of 4/2 and 4/12, while the output NMOS transistors are of size 25/2. FIG. 16 shows a schematic of the comparator 162 design. FIG. 17 shows a unit cell of the shift register 172. The shift register is a static flip-flop design. The flip-flop cell 164, 166 shown in FIG. 11 includes two invertors in series in a PMOS feedback switch between the input and output nodes.

Figure 18:
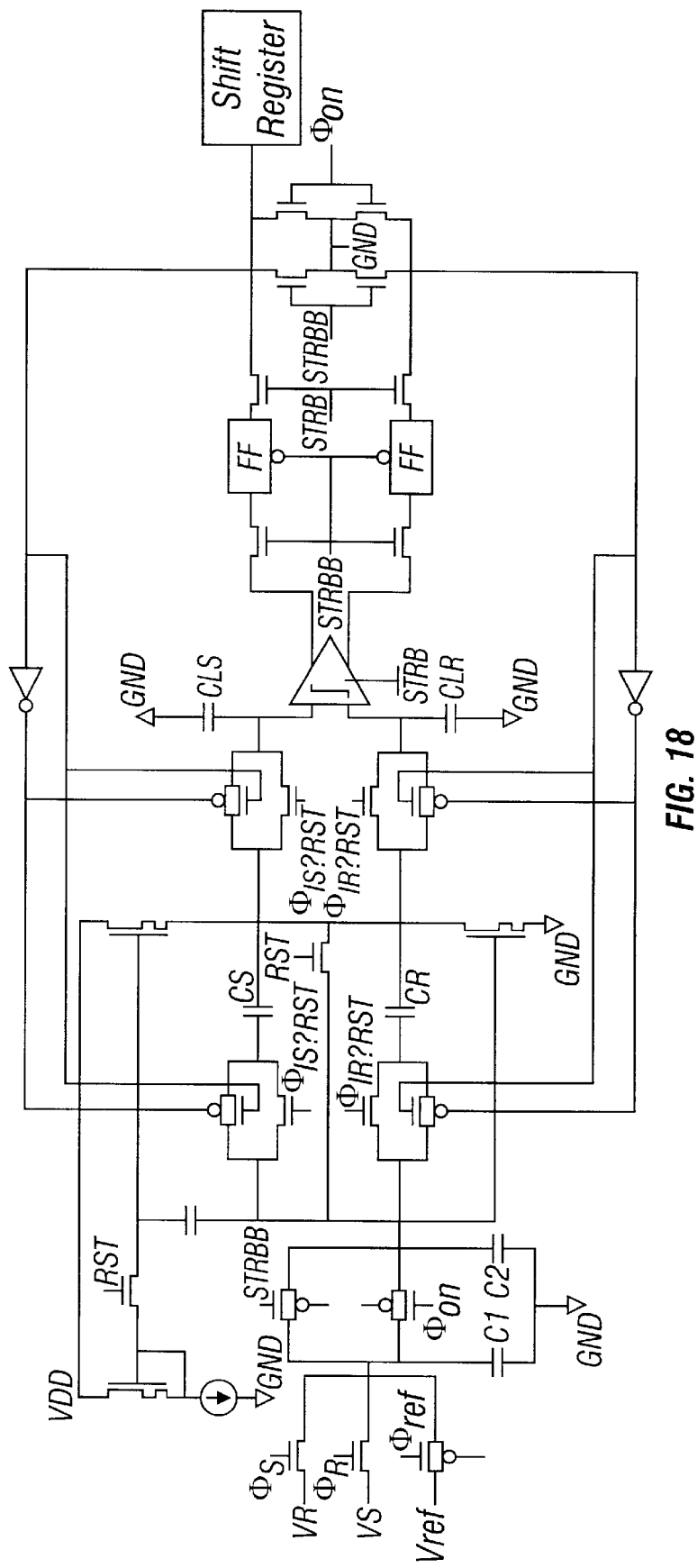
FIG. 18 is a circuit diagram showing a second embodiment of the present invention, this embodiment employing a single autobiasing self-cascoding inverter.

FIG. 18 shows a second embodiment of the present invention. This embodiment uses a single autobiasing self-cascoding inverter.

As noted above, the ADC accuracy relies more on the matching of the amplifier than on the DC gain of the amplifier. For example, a gain of 40 dB is enough for an 8-bit converter given a substantially perfect match in the amplifiers (which is achievable in a single amplifier system). A high-gain op-amp is not absolutely necessary.

Thus, a simple inverter amplifier can be used instead as the CTIA amplifier, as shown in FIG. 18. To ensure a reasonable gain of greater than, e.g., 40 dB, self-cascoding of the inverter transistors may be used. FIG. 18 shows a design of the ADC according to a second embodiment of the present invention using an autobiasing self-cascoded single inverter amplifier.

Compared with an op-amp, the dynamically biased inverter amplifier inherently has no offset problem, no 1/f noise, and no slew rate limitation. Using it for the CTIA in the ADC design substantially eliminates any nonlinearity error caused by the DC offset and reduces the power consumption at the same speed of operation.

The operation of this embodiment of the ADC is similar to that of the op-amp design. In this embodiment, however, the autobiasing of the inverter is also achieved in the autozeroing phase.

The negative input and the output are connected together during the autobiasing operation and the negative input. Thus, the negative input and the positive input are at the same potential as the feedback. This ensures that all the transistors in the amplifier are in saturation, thereby achieving autobiasing of the op-amp.

Figure 19:
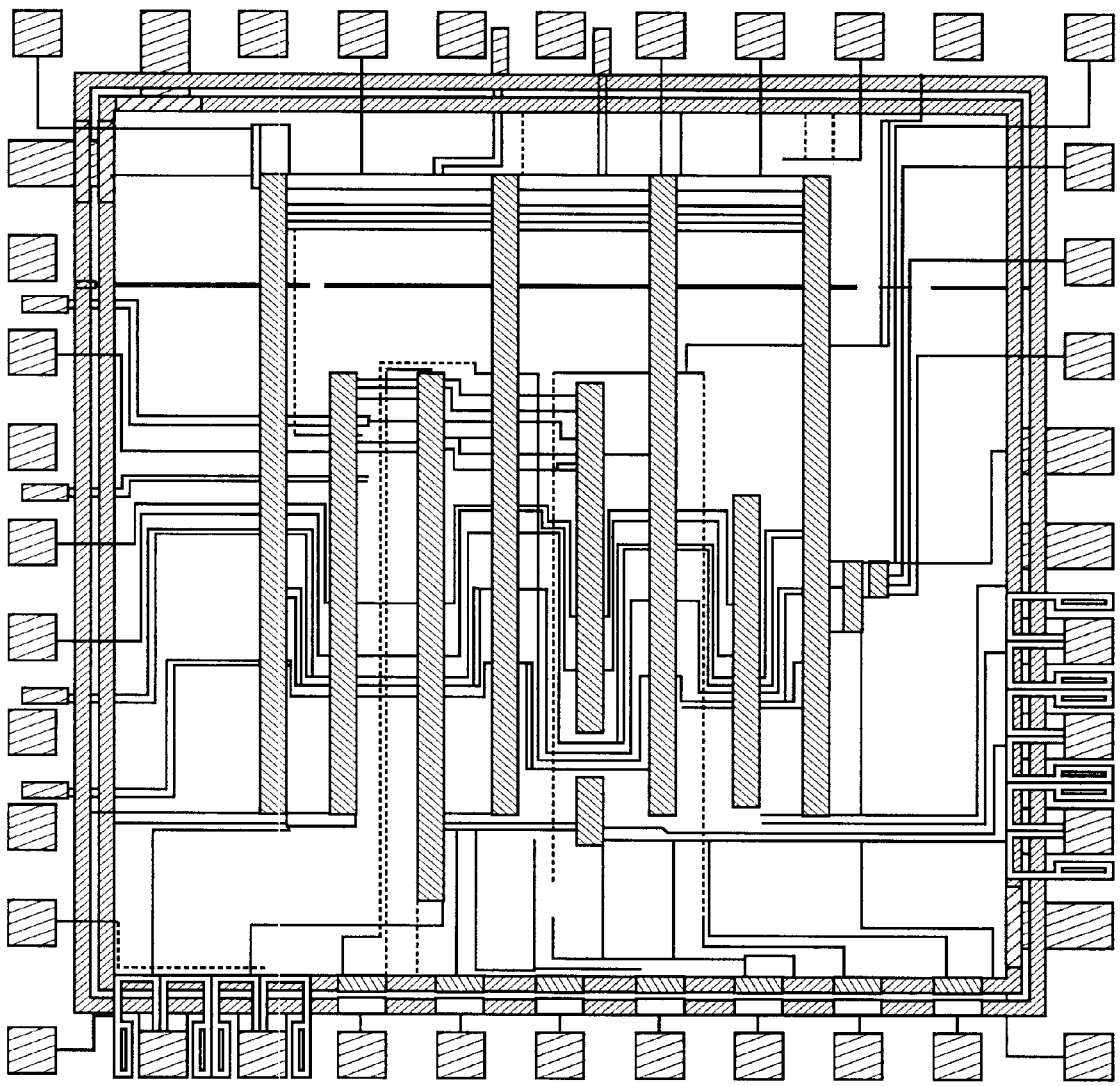
FIG. 19 shows a chip layout of the ADC according to an embodiment of the present invention.

A test chip was laid out using 2.0 micron n-well CMOS technology. FIG. 19 is a rough print-out of this chip. The chip has four column ADCs that vary in their autobiasing capacitance CB and their load capacitances CLR and CLS. A shift register for storing the digital data is not implemented and each ADC has its own serial digital output pad. The ADCs were laid out in 40 micron pitch which is scalable with the pixel pitch depending on the application technology.

A stand-alone inverter amplifier is also implemented for characterization purposes. The amplifier is about 150 microns long which can be reduced considerably by using smaller autozero capacitors and transistors. The overall ADC, without the shift register, is about 2.1 mm long.

Figure 20:
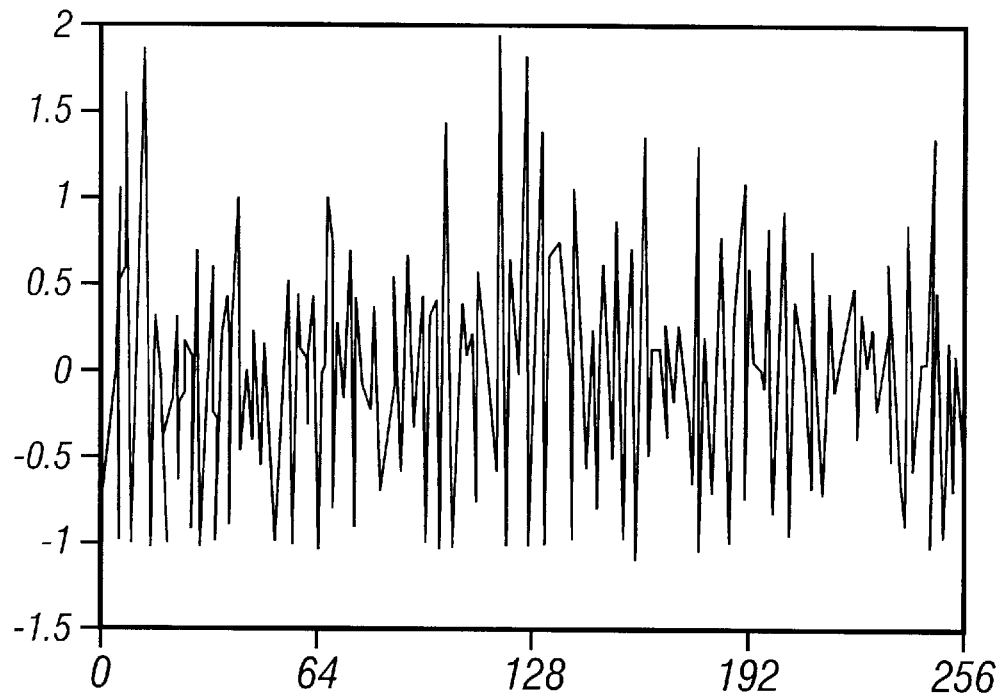
FIG. 20 is a graph of the nonlinearity DNL of the ADC plotted against the number of the transition step.
Figure 21:
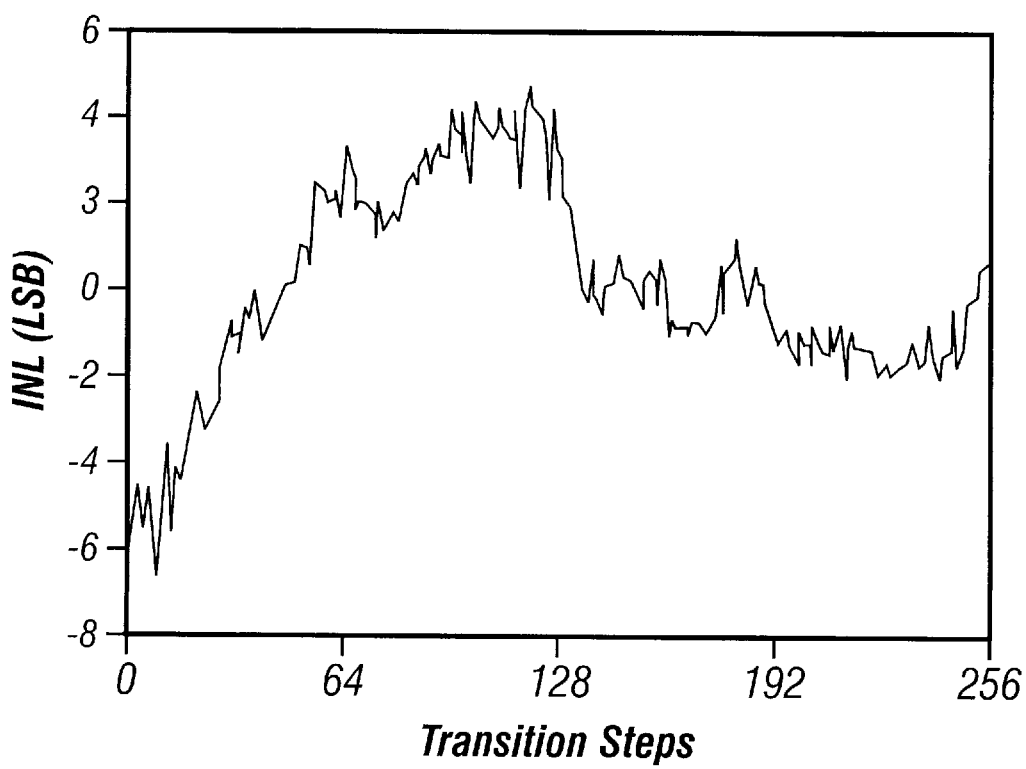
FIG. 21 is a graph of the nonlinearity INL of the ADC plotted against the number of the transition step.
Figure 22:
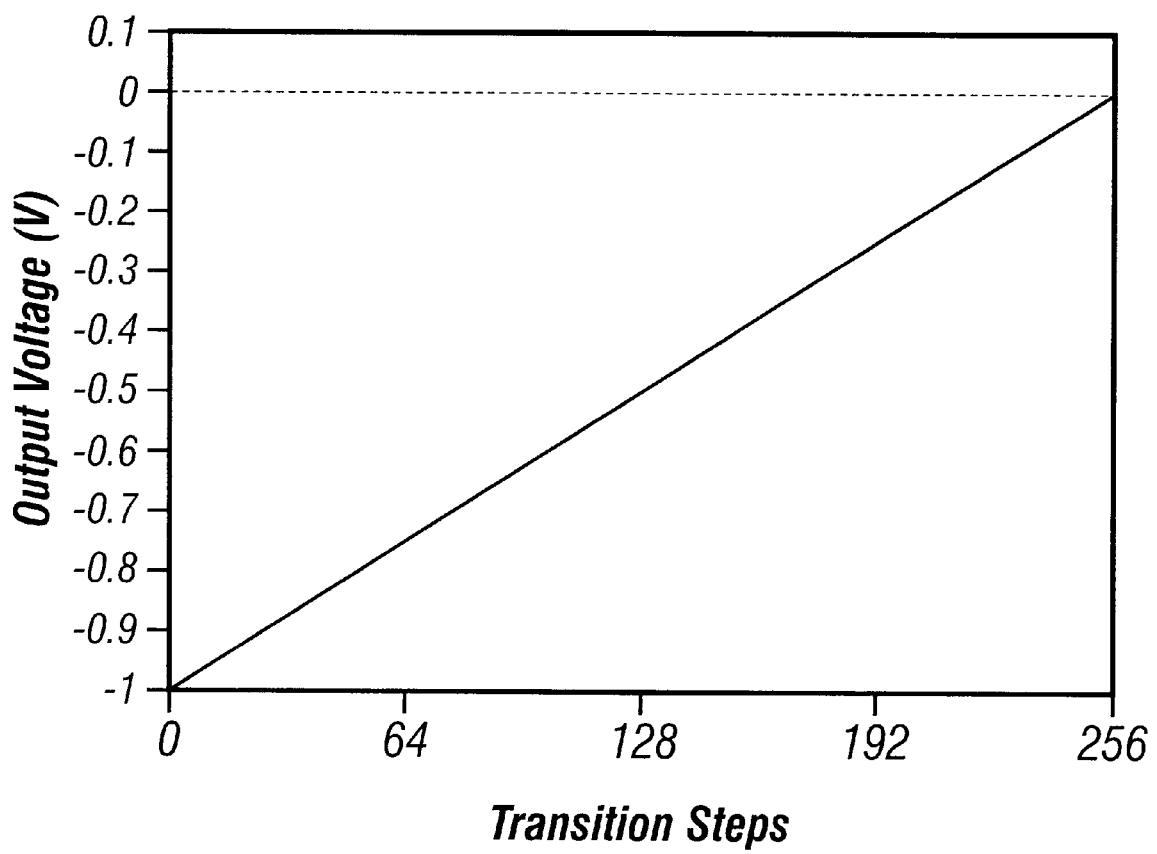
FIG. 22 is a graph of the transfer curve, showing output voltage plotted against the number of the transition step.

The chip employing the ADC was tested at a 55 kHz data rate. FIG. 20 shows the DNL measurement data. The figure indicates that an effective 7 bit resolution is obtained. FIG. 21 shows the INL measurement data. A bowing trend is apparent, causing large INL up to 8 LSB. This effect is caused by a mistake in the layout. In particular, the gate of the load transistor of the pixel source follower was left floating. This resulted in the source of the transistor being grounded while the drain was connected to the input nodes of VS and VR, as indicated by the schematic of FIG. 18.

Without this mistake, 7 bit resolution is readily achievable. It is noted also that an extra nonlinearity error is caused by the switch feedthrough in the conversion process.

Although only a few embodiments have been described in detail above, those having ordinary skill in the art will certainly understand that many modifications are possible in the preferred embodiment without departing from the teachings thereof.

All such modifications are intended to be encompassed within the following claims.

What is claimed is:

1. An analog-to-digital converter comprising: first and second charge integrating circuits employing first and second charge storage elements, said circuits capable of receiving an input charge and a reference charge, said circuits storing said charges in said first and second charge storage elements;
   a common charge integrating amplifier coupled to said first and second charge integrating circuits to generate an output signal proportional to the stored charge in the first or second charge storage elements, respectively;
   a comparator having two inputs, a first input receiving the output of said first charge storage element and a second input receiving the output of said second charge storage element, said comparator generating an output signal indicating which of said two inputs is larger;
   a subtraction circuit to subtract a portion of the reference charge from the charge stored in said first or second charge integrating circuit having the larger stored charge as determined by the comparator; and
   a register storing and outputting a series of results of a series of comparator outputs, each result representing a new bit in an output digital word that represents the differential voltage between the sample and reset inputs.

2. An analog-to-digital converter as in claim 1 wherein the circuits include sample and reset input switches responsive to the comparator output to transfer a portion of the reference charge to the circuit having the larger signal.

3. An analog-to-digital converter as in claim 1 wherein the portion is one-half.

4. An imaging system comprising:
   an array of image sensor pixels;
   an input receiving reset and sample output signals from individual pixels in the image sensor and also receiving a reference input;
   sample and hold charge storage elements coupled to the input;
   a reset circuit coupled to the sample and hold charge storage elements receiving said reset input charge values and employing a reset charge storage element;
   a sample circuit coupled to the sample and hold charge storage elements receiving said sample input charge value signal and employing a sample charge storage element;
   said reset circuit and said sample circuit employing a common charge integrating amplifier;
   a comparator having reset and sample inputs, the reset input coupled to the reset charge storage element and the sample input coupled to the sample charge storage element, the comparator producing an output indicating which input is larger;
   a switch allowing the reference voltage to be stored as charge in the sample and hold charge storage elements;
   the sample and reset circuits including sample and reset input switches responsive to the comparator output to transfer a portion of the reference charge in at least one of the sample and hold charge storage elements to the circuit having the larger signal;

wherein each circuit subtracts the portion of the reference charge from the existing reset or sample charge therein, and wherein the comparator repeats the comparison for each new smaller value of circuit output; and a register for storing and outputting the results of each comparison, each comparison representing a new bit in an output digital word representing the differential voltage between the sample and reset inputs.

5. The imaging system of claim 4 wherein said portion of the reference charge is one-half.

6. The imaging system of claim 4 wherein the sample and hold charge storage elements include two charge sharing capacitors, one of which transfers one-half of the total charge to the circuit, after which the charge in the second capacitor is shared with the first so each will have one-half the value prior to the transfer.

7. An imaging system according to claim 4 wherein said array of image sensors includes a column-parallel read output architecture.

8. An imaging system comprising:

an array of image sensors comprising an array of pixel sensors;

a column-parallel readout circuitry;

a plurality of successive approximation analog-to-digital converters on said substrate, each analog-to-digital converter comprising:

two inputs receiving a differential analog signal;

a reference input receiving a reference signal;

first and second circuits, coupled to receive the input signals, and generating an output signal, said first and second circuits employing a common charge integrating amplifier, said first and second circuits also employing first and second charge storage elements, respectively, for storing a charge representative of said output signal;

a comparator having two inputs receiving the output of each circuit, wherein a corresponding circuit subtracts a portion of the reference charge from the circuit having the larger signal and reduces the reference voltage each time a comparison is made by a predetermined fraction; and a register storing and outputting the results of each comparison, each comparison representing a new bit in the output digital word that represents the differential voltage between the sample and reset inputs.

9. An imaging system according to claim 8, wherein each column has one associated analog-to-digital converter.

10. An imaging system according to claim 8, wherein each analog-to-digital converter is connected to more than one column.

11. A method of performing analog-to-digital conversion comprising:

integrating a differential analog signal using a charge integrating amplifier, generating an output signal in response thereto, and storing a charge representative of said output signal on a first charge storage element;

integrating the reference signal using the charge integrating amplifier, generating an output signal in response thereto, and storing a charge representative of said output signal on a second charge storage element;

comparing the differential analog signal with the reference signal;

subtracting a portion of the reference charge from the compared signal having the larger signal, and reducing the reference signal each time a comparison is made by a predetermined fraction; and storing and outputting the results of each comparison as a digital word representing the value of the differential analog signal, each comparison representing a new bit in the output digital word.

12. A method of performing analog-to-digital conversion comprising:

receiving a first side of a differential signal to be digitized into as a charge value;

transferring said charge to a first branch of a circuit having a charge integrating amplifier and storing said charge on a first charge storage element;

receiving a reference charge value and splitting the reference charge value in half;

receiving the second side of the differential signal to be digitized as a charge value;

transferring the second side charge value to a second branch of a circuit having the charge integrating amplifier and storing said charge on a second charge storage element;

comparing the value of the charge on the first charge storage element with the one on the second charge storage element;

transferring one half of the split reference charge to the circuit with the lesser signal as determined in the comparing step, wherein the charge is increased by a value of one-half of the reference signal;

splitting the other one-half of the reference signal into two charges of one-fourth reference signal value;

repeating the comparing, transferring and splitting steps n-times and outputting a digital word containing n bits, wherein each bit represents which circuit branch had the larger charge in the comparing step.

13. An analog-to-digital converter comprising:

first and second circuits receiving and storing input charges and employing a common inverter amplifier to generate an output signal proportional to the stored charge, said first and second circuits employing first and second charge storage elements, respectively, for storing charge representative of said output signal of said first and second circuits;

a comparator having two inputs receiving the output of each of said first and second charge storage elements and generating an output signal indicating which input is larger;

said circuits subtracting a portion of the reference charge from the charge stored in the circuit having the larger stored charge as determined by the comparator; and a register storing and outputting a series of results of a series of comparator outputs, each result representing a new bit in an output digital word that represents the differential voltage between the sample and reset inputs.

14. The analog-to-digital converter of claim 13, wherein said inverter amplifier is an autobiasing self-cascoded single inverter amplifier.

15. An imaging system comprising:

an array of image sensor pixels;

an input receiving reset and sample output signals from individual pixels in the image sensor and also receiving an input reference voltage;

sample and hold capacitors coupled to the input and converting the output signals to charge values;

a reset circuit coupled to the sample and hold capacitors receiving said reset input charge values and employing a reset storage capacitor;

a sample circuit coupled to the sample and hold capacitors receiving said sample input charge value signal and employing a sample storage capacitor;

such that said reset circuit and said sample circuit employ a common inverter amplifier;

a comparator having reset and sample inputs, the reset input coupled to the reset storage capacitor and the sample input coupled to the sample storage capacitor, the comparator producing an output indicating which input is larger;

a switch allowing the reference voltage to be stored as charge in the sample and hold capacitors;

the sample and reset circuits including sample and reset input switches responsive to the comparator output to transfer a portion of the reference charge in the sample and hold capacitor to the circuit having the larger signal;

wherein each circuit subtracts the portion of the reference charge from the existing reset or sample charge therein, and wherein the comparator repeats the comparison for each new smaller value of circuit output; and a register storing and outputting the results of each comparison, each comparison representing a new bit in the output digital word representing the differential voltage between the sample and reset inputs.

16. An imaging system comprising:

an array of image sensors comprising an array of pixel sensors;

a column-parallel readout circuitry;

a plurality of successive approximation analog-to-digital converters on said substrate, each analog-to-digital converter comprising:

two inputs receiving a differential analog signal;

a reference voltage input receiving a reference voltage;

a voltage to charge converter coupled to the differential and reference inputs;

first and second circuits, coupled to the voltage to charge converter receiving two input signals from the voltage to charge converter, and generating an output signal, said first and second circuits employing a common inverter amplifier, said first and second circuits employing first and second capacitors, respectively, for storing a charge representative of said output signal;

a comparator having two inputs receiving the output of each circuit, wherein a corresponding circuit subtracts a portion of the reference charge from the circuit having the larger signal, and wherein the voltage to charge converter reduces the reference voltage each time a comparison is made by a predetermined fraction; and a register for storing and outputting the results of each comparison, each comparison representing a new bit in an output digital word that represents the differential voltage between the sample and reset inputs.

17. A method of performing analog-to-digital conversion comprising:

receiving a differential analog signal;

receiving a reference voltage;

converting the differential and reference inputs into charge, consecutively integrating the differential analog signal and the reference voltage using a single inverting amplifier, generating output signals in response thereto, and storing charges representative of said output signals on a first and second capacitor;

comparing the differential analog signal with the reference voltage;

subtracting a portion of the reference charge from the compared signal having the larger signal, and reducing the reference voltage each time a comparison is made by a predetermined fraction; and storing and outputting the results of each comparison as a digital word representing the value of the differential analog signal, each comparison representing a new bit in an output digital word.

18. A method of performing analog-to-digital conversion comprising:

converting a first side of a differential signal to be digitized into a charge value;

transferring said charge to a first branch of a circuit having an inverter amplifier and storing said charge on a first capacitor;

converting a reference voltage to a charge value; splitting the reference charge value in half;

converting the second side of the differential signal to be digitized into a charge value;

transferring the second side charge value to a second branch of a circuit having the same inverter amplifier and storing said charge on a second capacitor;

comparing the value of the charge on the first capacitor with the one on the second capacitor;

transferring one half of the split reference charge to the circuit with the lesser signal as determined in the comparing step, wherein the charge is increased by a value of one-half of the reference signal;

splitting the other one-half of the reference signal into two charges of one-fourth reference signal value;

repeating the comparing, transferring and splitting steps n-times and outputting a digital word containing n bits, wherein each bit represents which circuit branch had the larger charge in the comparing step.

19. An analog-to-digital converter comprising:

first and second charge integrating circuits employing first and second charge storage elements, said circuits capable of receiving an input charge and a reference charge, said circuits storing said charges in said first and second charge storage elements;

a common charge integrating amplifier coupled to said first and second charge integrating circuits to generate an output signal proportional to the stored charge in the first or second charge storage elements, respectively;

a comparator having two inputs, a first input receiving the output of said first charge storage element and a second input receiving the output of said second charge storage element, said comparator generating an output signal indicating which of said two inputs is larger;

a circuit to add a portion of the reference charge from the charge stored in said first or second charge integrating circuit having the smaller stored charge as determined by the comparator; and a register storing and outputting a series of results of a series of comparator outputs, each result representing a new bit in an output digital word that represents the differential voltage between the sample and reset inputs.

20. A method of performing analog-to-digital conversion comprising:

receiving a first side of a differential signal to be digitized into as a charge value;

transferring said charge to a first branch of a circuit having a charge integrating amplifier and storing said charge on a first charge storage element;

receiving a reference charge value and splitting the reference charge value in half;

receiving the second side of the differential signal to be digitized as a charge value;

transferring the second side charge value to a second branch of a circuit having the charge integrating amplifier and storing said charge on a second charge storage element;

comparing the value of the charge on the first charge storage element with the one on the second charge storage element;

transferring one half of the split reference charge to the circuit with the lesser signal as determined in the comparing step, wherein the charge is increased by a value of one-half of the reference signal;

splitting the other one-half of the reference signal into two charges of one-fourth reference signal value;

repeating the comparing, transferring and splitting steps n-times and outputting a digital word containing n bits, wherein each bit represents which circuit branch had the smaller charge in the comparing step.

* * * * *